United States Patent
Lin et al.

(10) Patent No.: US 8,278,179 B2
(45) Date of Patent: Oct. 2, 2012

(54) LDD EPITAXY FOR FINFETS

(75) Inventors: Da-Wen Lin, Hsin-Chu (TW); Che-Min Chu, Xinzhuang (TW); Tsung-Hung Li, Hsin-Chu (TW); Chih-Hung Tseng, Zhutang Township (TW); Yen-Chun Lin, Hsin-Chu (TW); Chung-Cheng Wu, Chu-Bei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 78 days.

(21) Appl. No.: 12/720,476

(22) Filed: Mar. 9, 2010

(65) Prior Publication Data

US 2011/0223736 A1    Sep. 15, 2011

(51) Int. Cl.
*H01L 21/336* (2006.01)
(52) U.S. Cl. .. 438/305; 438/300; 438/303; 257/E21.431
(58) Field of Classification Search .................. 438/151, 438/197, 199, 303, 305, 300; 257/E21.431
See application file for complete search history.

(56) References Cited

U.S. PATENT DOCUMENTS

| | | | |
|---|---|---|---|
| 6,372,589 B1 * | 4/2002 | Yu ................................. | 438/304 |
| 6,706,571 B1 | 3/2004 | Yu et al. | |
| 6,858,478 B2 | 2/2005 | Chau et al. | |
| 7,190,050 B2 | 3/2007 | King et al. | |
| 7,247,887 B2 | 7/2007 | King et al. | |
| 7,265,008 B2 | 9/2007 | King et al. | |
| 7,268,024 B2 * | 9/2007 | Yeo et al. ...................... | 438/151 |
| 7,508,031 B2 | 3/2009 | Liu et al. | |
| 7,528,465 B2 | 5/2009 | King et al. | |
| 7,605,449 B2 | 10/2009 | Liu et al. | |
| 7,611,938 B2 * | 11/2009 | Cheng et al. .................. | 438/199 |
| 7,667,271 B2 * | 2/2010 | Yu et al. ........................ | 257/347 |
| 2004/0108559 A1 * | 6/2004 | Sugii et al. .................... | 257/411 |
| 2005/0153490 A1 | 7/2005 | Yoon et al. | |
| 2005/0239254 A1 | 10/2005 | Chi et al. | |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0145487 A1 * | 6/2007 | Kavalieros et al. ........... | 257/368 |
| 2007/0281446 A1 * | 12/2007 | Winstead et al. ............. | 438/478 |
| 2008/0048262 A1 * | 2/2008 | Lee et al. ....................... | 257/347 |
| 2008/0054349 A1 | 3/2008 | Cheng et al. | |
| 2008/0121932 A1 * | 5/2008 | Ranade ......................... | 257/192 |
| 2008/0290470 A1 | 11/2008 | King et al. | |
| 2008/0296632 A1 | 12/2008 | Moroz et al. | |
| 2009/0181477 A1 | 7/2009 | King et al. | |
| 2010/0078733 A1 * | 4/2010 | Masuoka et al. .............. | 257/384 |

* cited by examiner

*Primary Examiner* — Leonard Chang
(74) *Attorney, Agent, or Firm* — Slater & Matsil, L.L.P.

(57) ABSTRACT

A method of forming a semiconductor structure includes providing a substrate including a fin at a surface of the substrate, and forming a fin field-effect transistor (FinFET), which further includes forming a gate stack on the fin; forming a thin spacer on a sidewall of the gate stack; and epitaxially growing a epitaxy region starting from the fin. After the step of epitaxially growing the epitaxy region, a main spacer is formed on an outer edge of the thin spacer. After the step of forming the main spacer, a deep source/drain implantation is performed to form a deep source/drain region for the FinFET.

5 Claims, 9 Drawing Sheets

LDD EPITAXY FOR FINFETS

TECHNICAL FIELD

This disclosure relates generally to semiconductor devices, and more particularly to the methods of forming lightly doped source and drain (LDD) regions and epitaxy regions for fin field-effect transistors (FinFETs).

BACKGROUND

With the downscaling of integrated circuits, metal-oxide-semiconductor (MOS) devices become increasingly smaller. The junction depths of the MOS devices are also reduced accordingly. This reduction causes technical difficulties for the formation processes of MOS devices. For example, in order to reduce source and drain resistance, small MOS devices demand high source and drain dopant concentrations and/or increased junction depths. However, high dopant concentrations, particularly in lightly doped source and drain (LDD) regions, result in the increase in the leakage currents, while the increase in the junction depths of LDD regions results in the compromise of short channel characteristics of the resulting MOS devices.

SUMMARY

In accordance with one aspect, a method of forming a semiconductor structure includes providing a substrate including a fin at a surface of the substrate, and forming a fin field-effect transistor (FinFET), which further includes forming a gate stack on the fin; forming a thin spacer on a sidewall of the gate stack; and epitaxially growing a epitaxy region starting from the fin. After the step of epitaxially growing the epitaxy region, a main spacer is formed on an outer edge of the thin spacer. After the step of forming the main spacer, a deep source/drain implantation is performed to form a deep source/drain region for the FinFET.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 17 are cross-sectional views of intermediate stages in the manufacturing of fin field-effect transistors (FinFETs) in accordance with embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A method for forming fin field-effect transistors (FinFETs) is provided. The intermediate stages of manufacturing an embodiment, which combine the formation of a p-type FinFET and an n-type FinFET, are illustrated. Throughout the various views and illustrative embodiments, like reference numbers are used to designate like elements.

Figure 1:
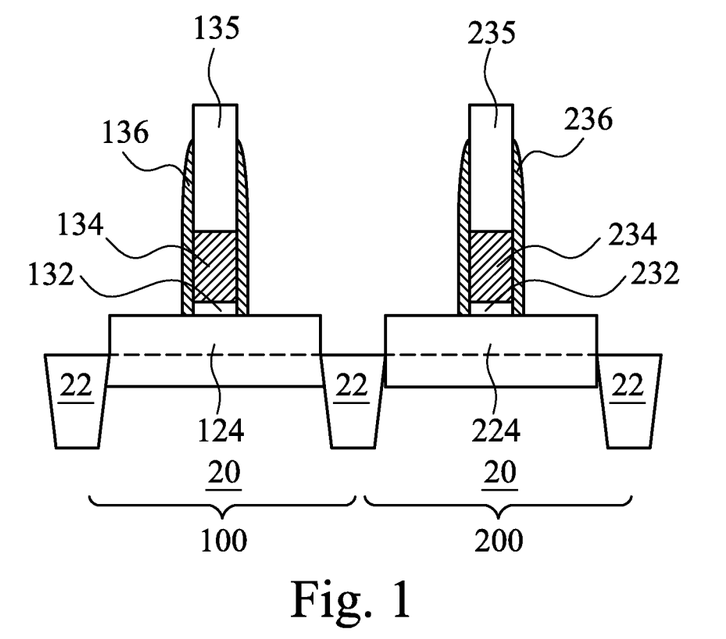

Referring to FIG. 1, substrate 20, which comprises a portion in NMOS region 100 and a portion in PMOS region 200, is provided. Substrate 20 may be a bulk silicon substrate, although other commonly used structures and materials, such as silicon-on-insulator (SOI) structures and silicon alloys, can be used. Substrate 20 may be doped with a p-type or an n-type impurity. Isolation regions, such as shallow trench isolation (STI) regions 22 may be formed in or over substrate 20. Semiconductor fins 124 and 224, which are semiconductor regions over the top surfaces of adjoining STI regions 22, are formed, and are in NMOS device region 100 and PMOS device region 200, respectively. The process steps for forming semiconductor fins 124 and 224 are well known in the art, and hence are not discussed herein.

A first gate stack, including gate dielectric 132 and gate electrode 134, is formed on the top surface and sidewalls of semiconductor fin 124. A second gate stack, including gate dielectric 232 and gate electrode 234, is formed on the top surface and sidewalls of semiconductor fin 224. Gate electrodes 134 and 234 may be formed of commonly used conductive materials, such as polysilicon, metals, metal silicides, metal nitrides, and combinations thereof. Gate dielectrics 132 and 232 may include commonly used dielectric materials, such as oxides, nitrides, oxynitrides, carbides, and combinations thereof. Each of the gate stacks may further include mask layer 135/235 on respective gate electrodes 134 and 234, wherein the mask layers may be formed of silicon nitride.

FIG. 1 also illustrates the formation of thin spacers 136 and 236. Thin spacers 136 and 236 may have thicknesses less than about 100 Å, for example, although different thicknesses are also applicable. One skilled in the art will realize that the dimensions recited throughout the description are merely examples and will change if different formation technologies are used. The usable materials of thin spacers 136 and 236 include commonly used spacer material such as oxides (silicon oxide, for example). As is known in the art, the formation of thin spacers 136 and 236 may include forming a spacer layer, and then patterning the spacer layer to remove its horizontal portions.

Figure 2:
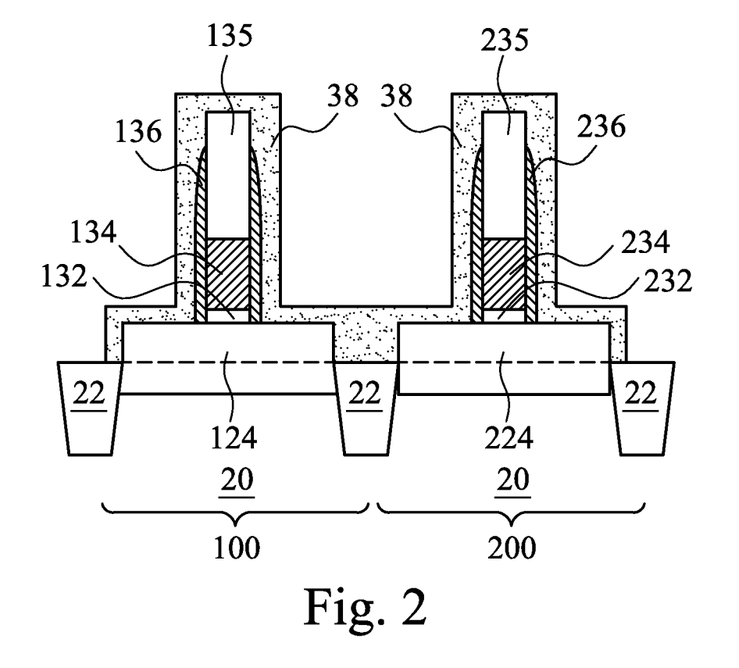
Figure 3:
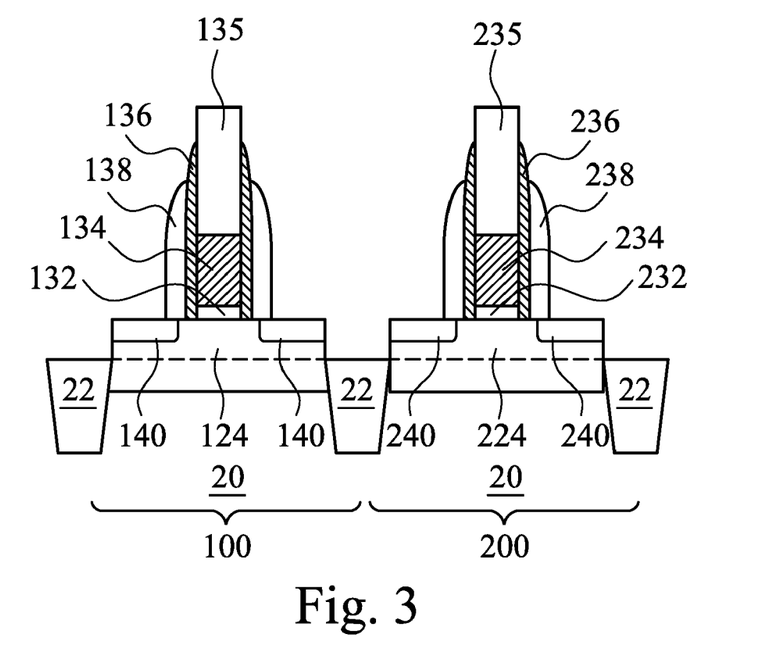

Referring to FIG. 2, mask layer 38, which may be formed of a material different from the material of thin spacers 136 and 236, is blanket formed. In an embodiment, mask layer 38 is formed of silicon nitride. Mask layer 38 may have an exemplary thickness less than about 100 Å. Next, as shown in FIG. 3, mask layer 38 is etched and the remaining vertical portions of mask layer 38 on sidewalls of thin spacers 136 and 236 form thin spacers 138 and 238, respectively. Throughout the description, thin spacers 136 and 138 in combination are also referred to as a thin spacer, and thin spacers 236 and 238 in combination are also referred to as a thin spacer.

FIG. 3 also illustrates the implantations for forming lightly doped source and drain (LDD) regions, wherein an n-type impurity is implanted into fin 124, while a p-type impurity is implanted into fin 224 so that LDD regions 140 and 240 are formed in fins 124 and 224, respectively. An annealing may be performed. As a result, the diffusion of the n-type and p-type impurities may cause LDD regions 140 and 240 to extend under the respective thin spacers 136/138 and 236/238. Each of the n-type impurity and the p-type impurity may be doped to a concentration between about $5*10^{19}/cm^3$ and about $1*10^{20}/cm^3$, or possibly between about $1*10^{18}/cm^3$ and about $5*10^{19}/cm^3$, although different concentrations suitable for the LDD regions may also be used.

Figure 4:
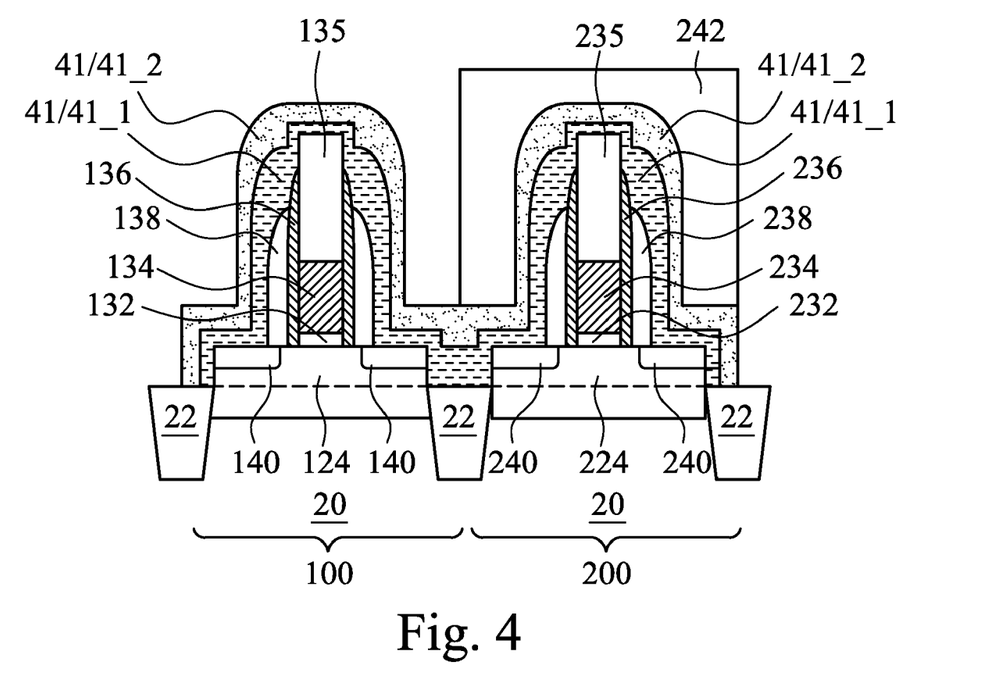

In FIG. 4, mask layer 41 is formed to cover the structures in both NMOS region 100 and PMOS region 200, followed by the formation of photo resist 242 to cover PMOS region 200, while NMOS region 100 is not covered. Mask layer 41 may comprise oxide layer 41_1 and silicon nitride layer 41_2.

Figure 5:
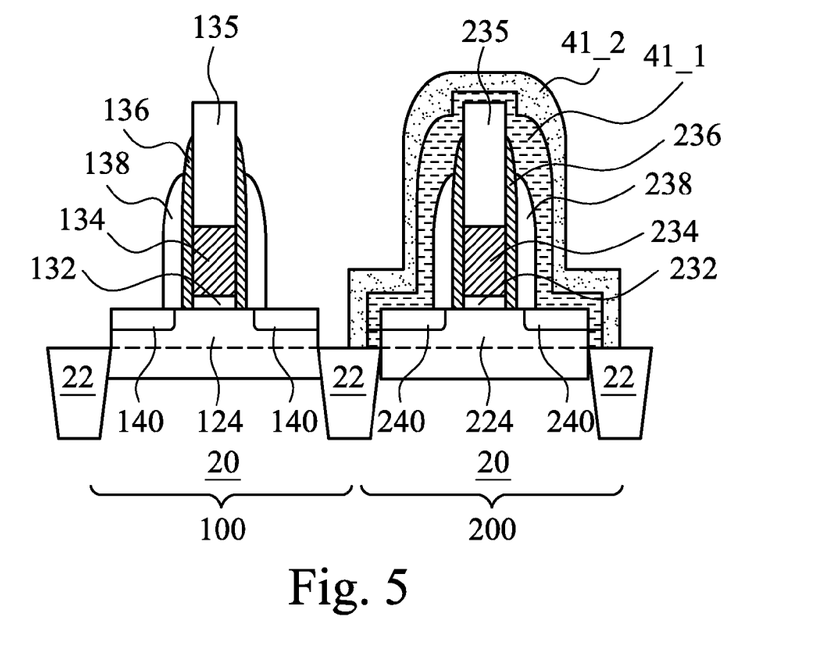

Next, as shown in FIG. 5, the exposed portion of mask layer 41 in NMOS region 100 is removed. Photo resist 242 is then removed. It is noted that the removal of mask layer 41 may, or may not, cause the loss of portions of fin 124 as a side effect, wherein dotted lines 125 indicate the upper surfaces of fin 124 after the loss of portions of fin 124.

Figure 6A:
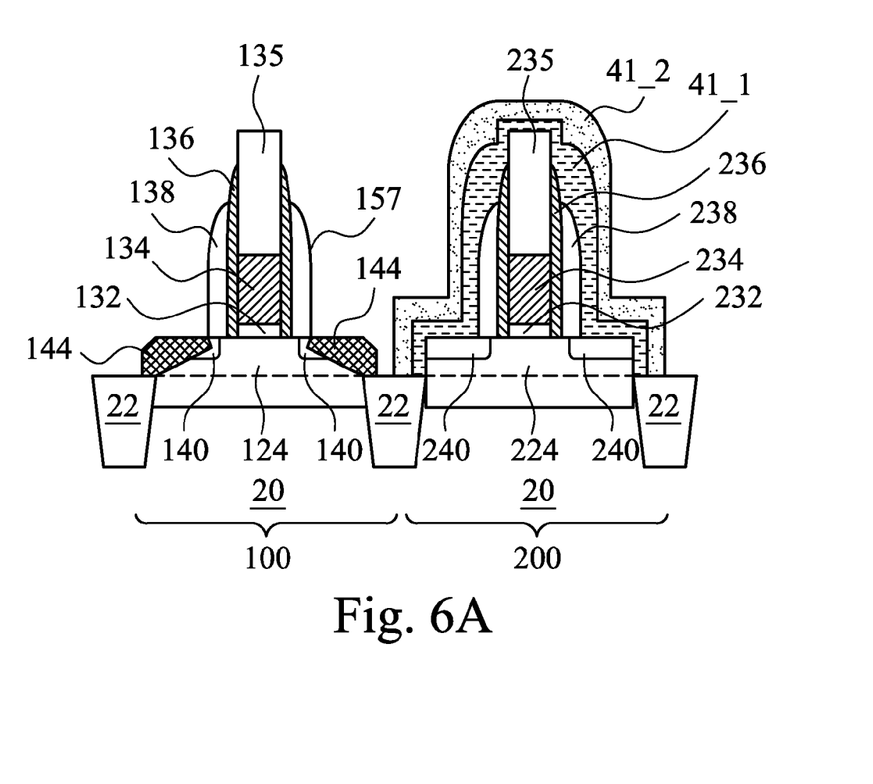
Figure 6B:
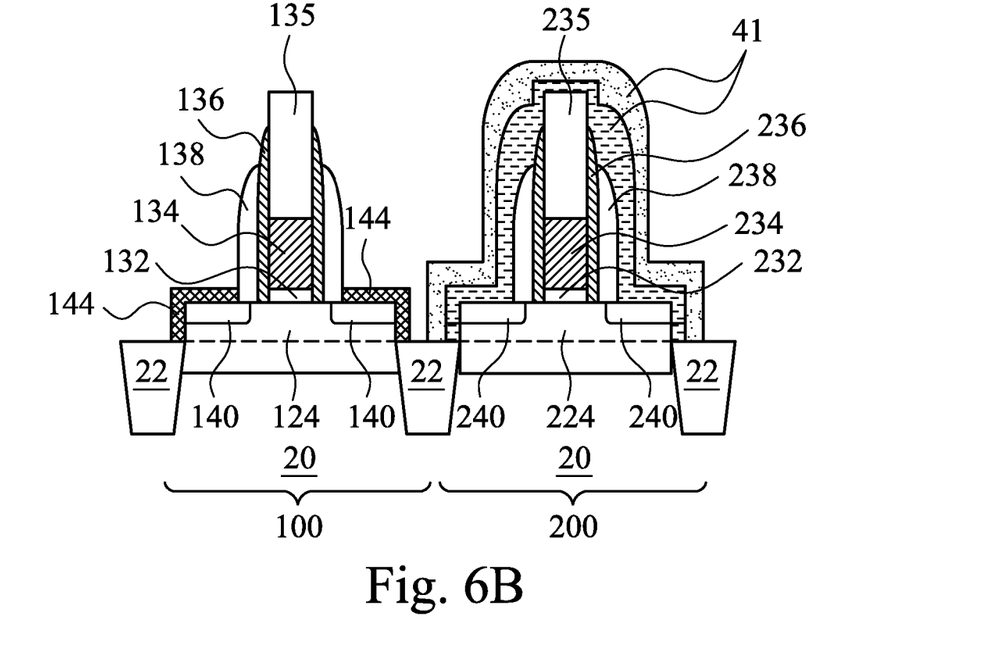
Figure 7:
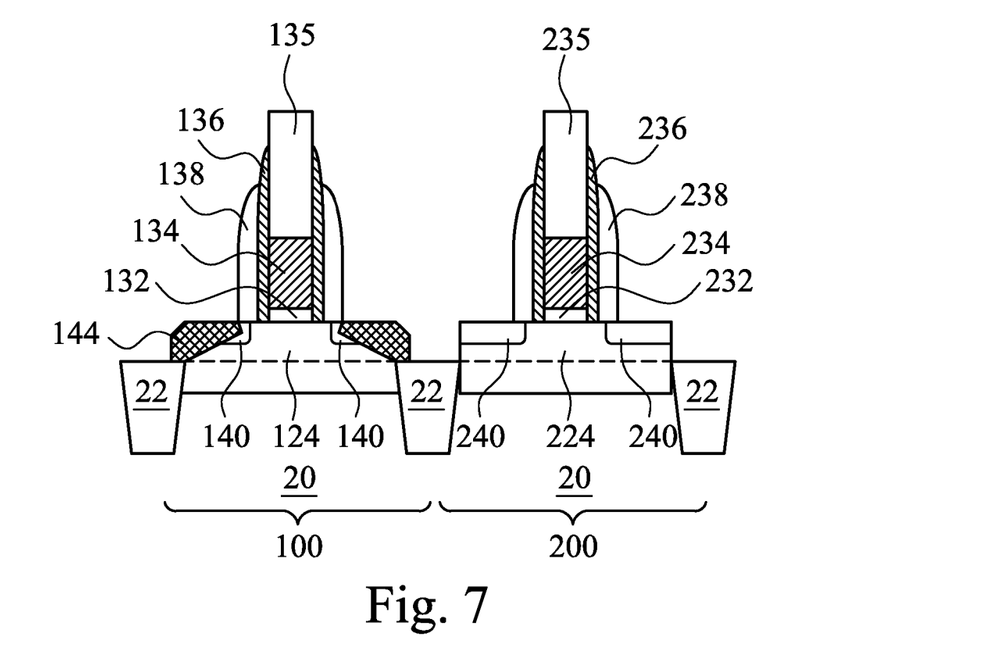

Referring to FIGS. 6A and 6B, epitaxy regions 144 are formed on exposed surfaces of fin 124, for example, by a selective epitaxial growth (SEG). The inner edges of epitaxy regions 144 may be substantially vertically aligned to outer sidewalls 157 of thin spacers 138. Epitaxy regions 144 may be formed of silicon phosphorous (SiP), silicon carbon, or the like. In the case silicon carbon is epitaxially grown, an n-type impurity, such as phosphorous, may be in-situ doped with the proceeding of the epitaxial growth. In an embodiment, the phosphorous has an atomic percentage greater than about 0.2 percent, and the concentration of phosphorous may be greater than about $1*10^{20}/cm^3$ in the SiP. In the embodiments semiconductor fin 124 is lost during the removal of portions of mask layer 41 (referring to dotted lines 125 in FIG. 5), the top surface of the resulting epitaxy regions 144 is grown to higher than the top surface of fin 124, and the resulting structure is shown in FIG. 6A. Alternatively, if fin 124 is substantially not lost during the removal of mask layer 41, epitaxy regions 144 are formed on the exposed top surface and sidewalls of fin 124, as shown in FIG. 6B. In an exemplary embodiment, the thickness of epitaxy regions 144 is between about 50 Å and about 400 Å. After the formation of epitaxy regions 144, mask layer 41 is removed and the resulting structure is shown in FIG. 7.

Figure 8:
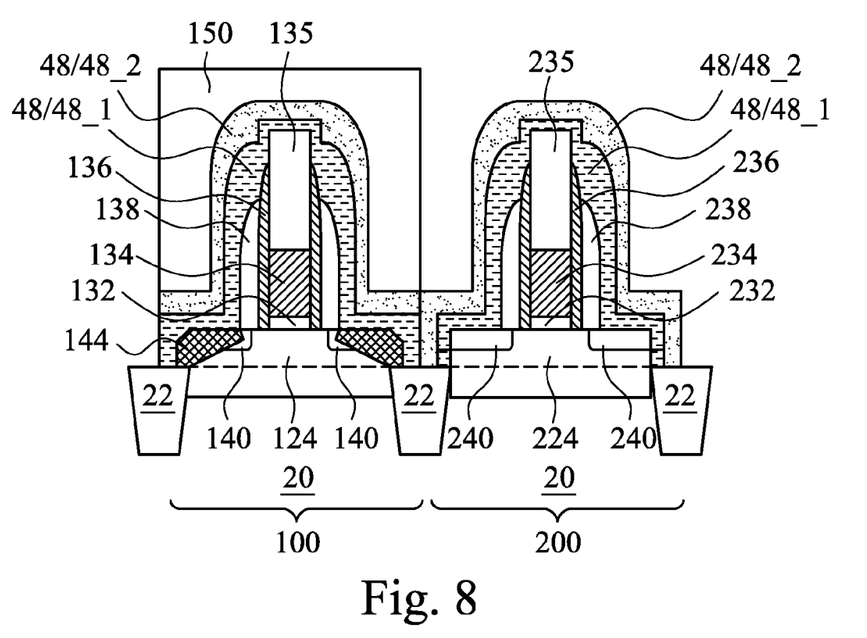
Figure 9:
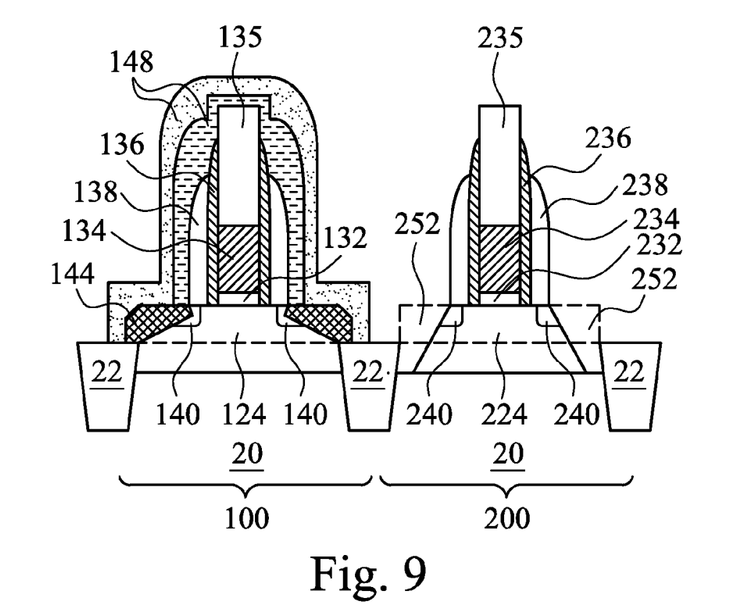
Figure 10:
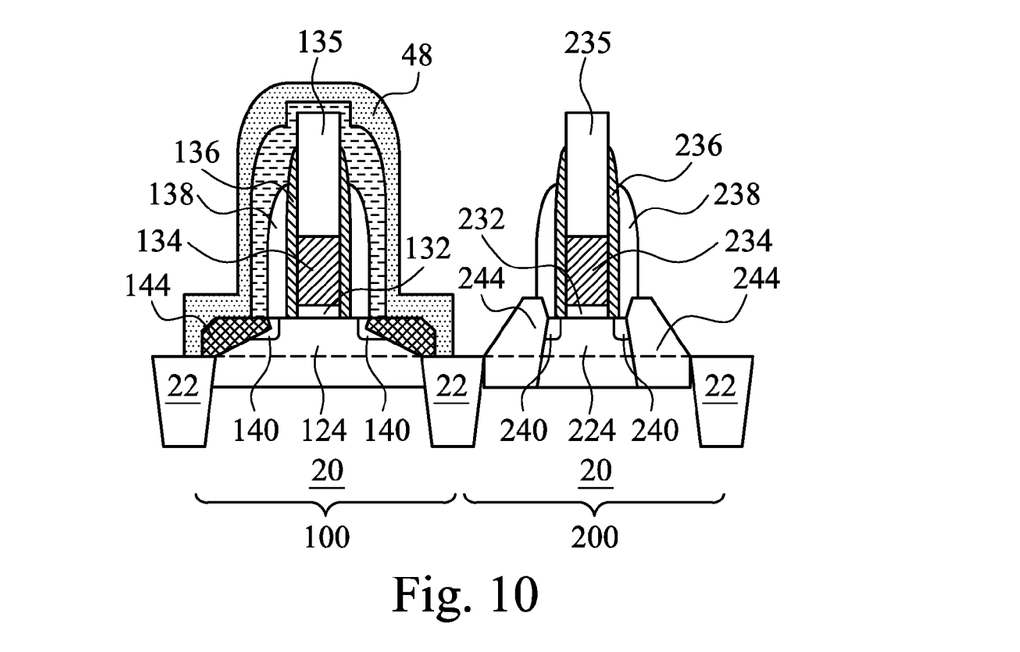

FIGS. 8 through 10 illustrate the formation of epitaxy regions 244 on fin 224. In FIG. 8, mask layer 48 is formed to cover the structures in both NMOS region 100 and PMOS region 200, followed by the formation of photo resist 150 to cover NMOS region 100, while PMOS region 200 is not covered. Mask layer 48 may comprise oxide layer 48_1 and silicon nitride layer 48_2 on oxide layer 48_1. Next, as shown in FIG. 9, the exposed portion of mask layer 48 in PMOS region 200 is removed. Photo resist 150 is then removed. A recess is then performed using thin spacers 236/238 as masks to form recesses 252 in fin 224. If viewed from the left or right of FIG. 9, recesses 252 actually represent the spaces left by the removed portions of fin 224, with the boundaries of recesses 252 being marked by dotted lines. In an embodiment, recesses 252 may extend to below the top surfaces of STI regions 22.

Figure 11:
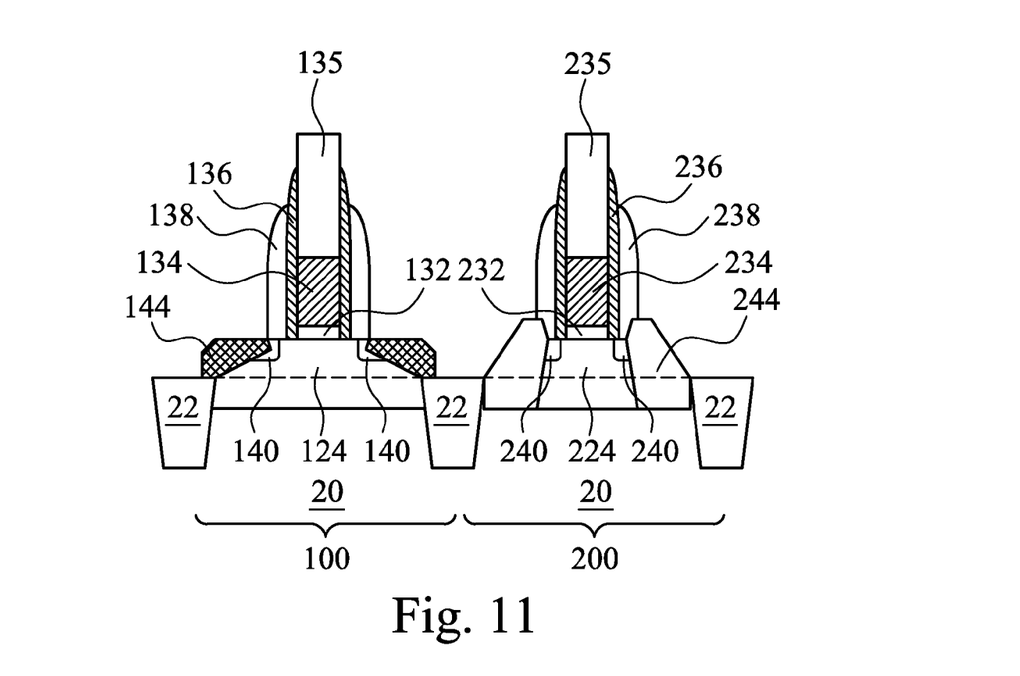

Referring to FIG. 10, epitaxy regions 244 are formed starting from exposed surfaces of fin 224, for example, by a selective epitaxial growth (SEG). The inner edges of epitaxy regions 244 may be substantially vertically aligned to the outer sidewalls 257 of thin spacers 238. Epitaxy regions 244 may be formed of silicon germanium (SiGe), silicon, or the like. Epitaxy regions 244 are also referred to as SiGe stressors hereinafter. The resulting SiGe regions 244 may have germanium atomic percentages between about 10 atomic percent and about 40 atomic percent, although different atomic percentages are also applicable. In an embodiment, no p-type dopant is doped during the epitaxial growth of epitaxy regions 244. In alternative embodiments, p-type impurities, such as boron and/or indium, are in-situ doped with the proceeding of the epitaxial growth to a concentration between about $1*10^{18}/cm^3$ and about $1*10^{21}/cm^3$. The top surface of the resulting epitaxy regions 244 may be higher than or level with the top surface of the original fin 224. In an exemplary embodiment, the thickness of epitaxy regions 244 is between about 50 Å and about 1,500 Å. After the formation of epitaxy regions 244, mask layer 48 is removed and the resulting structure is shown in FIG. 11.

Figure 12:
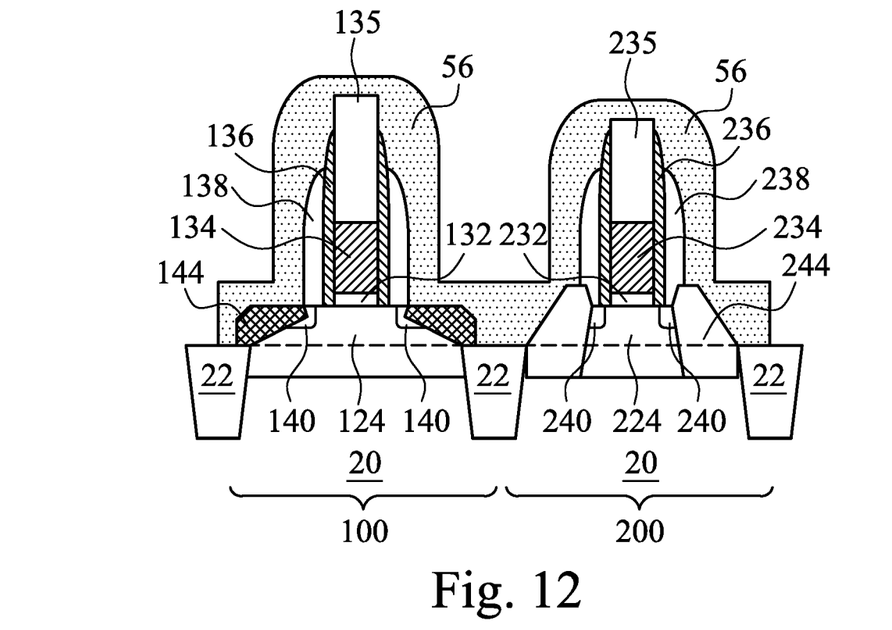
Figure 13:
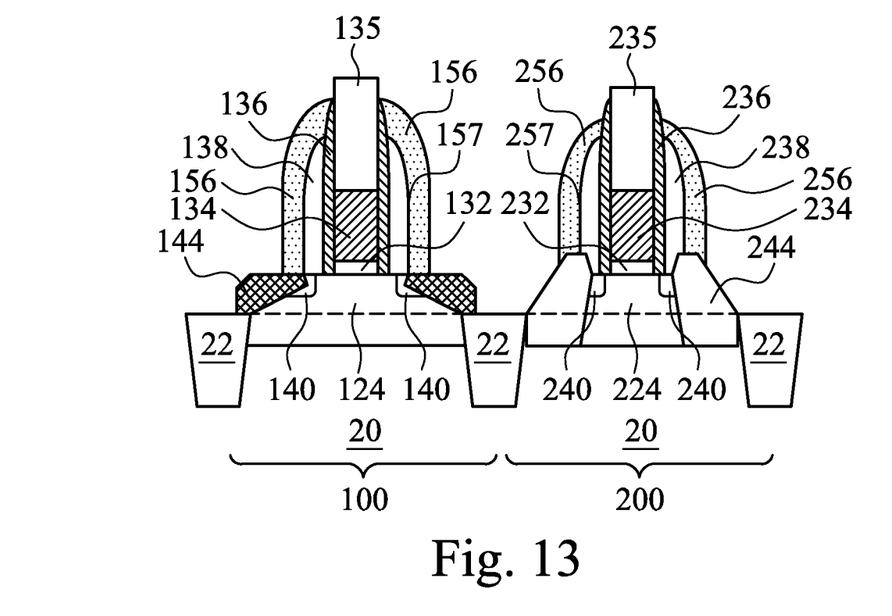

FIGS. 12 and 13 illustrate the formation of main spacers 156 and 256, which may be formed by blanket depositing dielectric layer 56 (FIG. 12), and then removing horizontal portions of dielectric layer 56 (FIG. 13). Accordingly, main spacers 156 are formed on outer sidewalls 157 of thin spacers 138, and main spacers 256 are formed on outer sidewalls 257 of thin spacers 238. Further, the inner edges of epitaxy regions 144 are vertically aligned to the interface (also marked as 157) between main spacers 156 and thin spacers 138, and the inner edges of epitaxy regions 244 are vertically aligned to the interface (also marked as 257) between main spacers 256 and thin spacers 238. The deposition may be performed using commonly used techniques, such as plasma enhanced chemical vapor deposition (PECVD), low-pressure chemical vapor deposition (LPCVD), sub-atmospheric chemical vapor deposition (SACVD), and the like. The patterning may be performed by dry etching, for example. In an embodiment, main spacers 156 and 256 are formed of silicon nitride. In alternative embodiments, main spacers 156 and 256 include liner oxide portions and overlying nitride portions. In yet other embodiments, main spacers 156 and 256 include one or more layers, each comprising oxide, silicon nitride, silicon oxynitride (SiON) and/or other dielectric materials.

Figure 14:
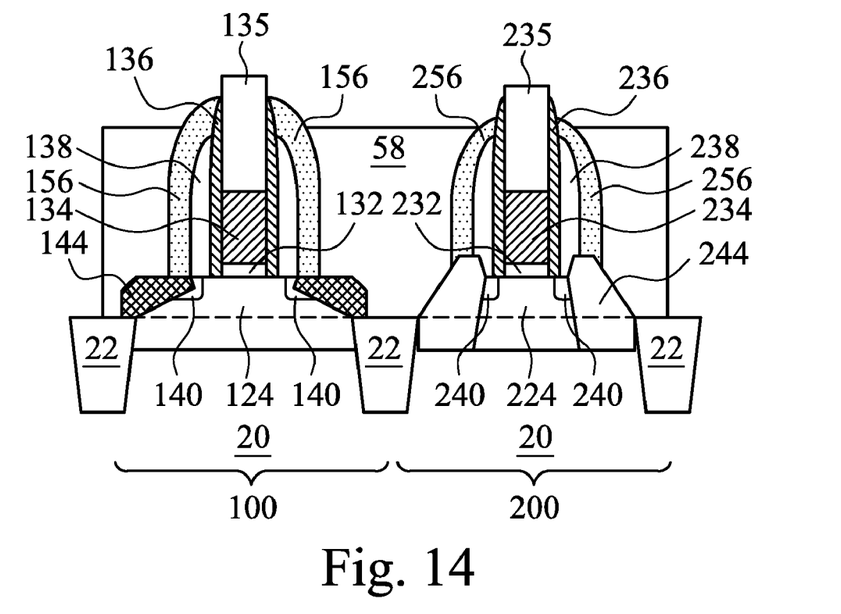
Figure 15:
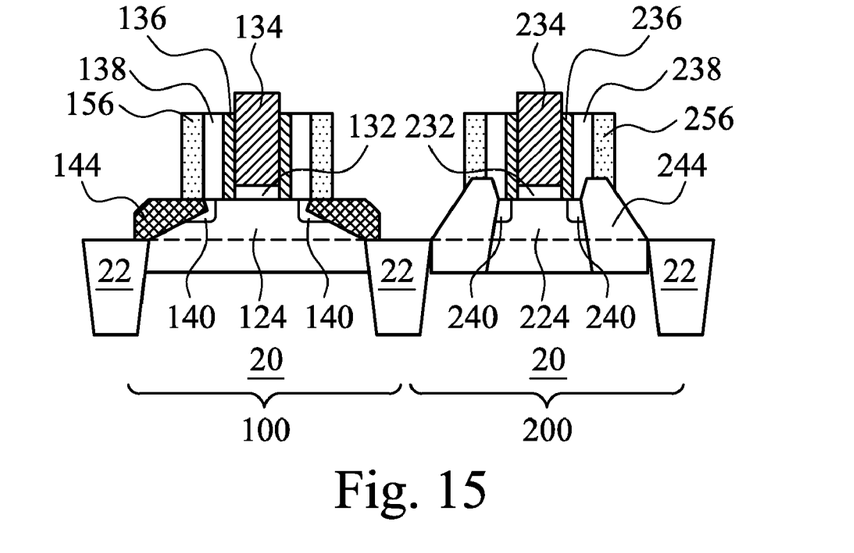

Referring to FIG. 14, photo resist 58 is applied and etched back, until hard masks 135 and 235 are exposed. The exposed hard masks 135 and 235 are then removed. Photo resist 58 is then removed by ashing, and the resulting structure is shown in FIG. 15.

Figure 16:
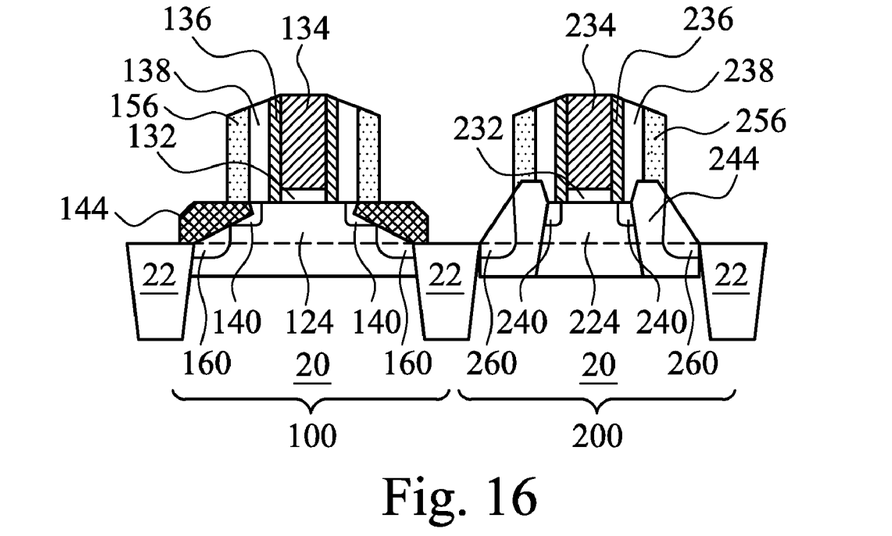

Next, as shown in FIG. 16, deep implantations are performed to form deep source and drain regions 160 and 260 (hereinafter referred to as source/drain regions). As is known in the art, to form deep source/drain regions, a photo resist (not shown) is formed to cover NMOS region 100. An implantation is then preformed to introduce p-type impurities to form deep source/drain regions 260. The photoresist is then removed. An additional photo resist (not shown) is formed to cover PMOS region 200 and an implantation is preformed to introduce n-type impurities to form deep source/drain regions 160. The additional photo resist is then removed. The doping concentration of source/drain regions 160 and 260 may be between about $1*10^{20}/cm^3$ and about $1*10^{21}/cm^3$, or even higher.

Figure 17:
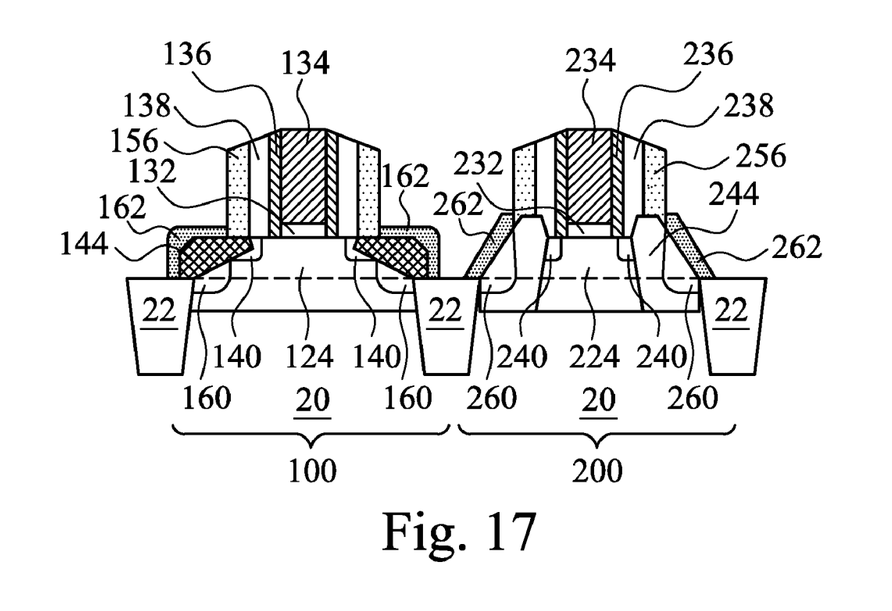

FIG. 17 illustrates the formation of silicide regions 162 (which may be germano-silicide regions) and 262. As is known in the art, silicide regions 162 and 262 may be formed by blanket depositing a thin layer of metal, such as nickel, platinum, palladium, titanium, cobalt, and combinations thereof. The substrate is then heated, which causes silicon and germanium to react with the metal where contacted. After the reaction, a layer of metal silicide is formed between the silicon (or silicon germanium) and the metal. The un-reacted metal is selectively removed through the use of an etchant that attacks metal but does not attack silicide and germano-silicide. It is noted that the inner edges of silicide regions 162 and 262 are substantially vertically aligned to the outer sidewalls of main spacers 156 and 256, respectively. Epitaxy regions 144 and 244, on the other hand, extend directly under the respective main spacers 156 and 256. The inner edges of epitaxy regions 144 and 244 may be substantially aligned to the inner sidewalls of main spacers 156 and 256. Further, portions of epitaxy regions 144 and 244 that are directly underlying the respective main spacers 156 and 256 may have a low impurity concentration since they do not receive the respective deep source/drain implantation.

In the embodiments, the formation of epitaxy regions 144 and 244 results in the reduction in the junction leakage currents without causing the sacrifice in the short channel characteristics. The sheet resistance of the source and drain regions is reduced. Simulation results have revealed that the sheet resistance of a PMOS FinFET may be reduced by about 30% percent. Further, by using silicon germanium to form epitaxy regions 244, the stress applied to the channel regions of the resulting p-type FinFET may be increased by about 50 MPa to about 100 MPa, which in turn may result in the drive current of the p-type FinFET to increase by about 2.5 percent to about 5 percent (when thin spacers 236 and 238 have a combined thickness of about 15 nm to about 20 nm). The benefit of the increase in the drive current due to the increase in stress is maximized due to the fact that epitaxy regions 144 and 244 extend to directly under main spacers 156 and 256, respectively, and hence are close to the channel regions of the respective FinFETs.

On the other hand, the formation of epitaxy regions 144 results in the reduction in the leakage current in the n-type FinFET without compromising the short channel characteristics of the n-type FinFET.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor structure, the method comprising:
   providing a semiconductor substrate comprising a first fin in a PMOS region and a second fin in an NMOS region;
   forming a p-type FinFET in the PMOS region comprising:
      forming a first gate stack on the first fin;
      forming a first thin spacer on a sidewall of the first gate stack;
      performing a first lightly doped source/drain (LDD) implantation in the first fin;
      after the step of performing the first LDD implantation, forming a recess in the first fin using the first thin spacer as a mask;
      epitaxially growing a first epitaxy region in the recess; and
      after the step of epitaxially growing the first epitaxy region, forming a first main spacer on a sidewall of the first thin spacer; and
   forming an n-type FinFET in the NMOS region comprising:
      forming a second gate stack on the second fin;
      forming a second thin spacer on a sidewall of the second gate stack;
      performing a second LDD implantation in the second fin;
      epitaxially growing a second epitaxy region on exposed portions of a top surface and sidewalls of the second fin, wherein the lowest point of the first epitaxy region is lower than the lowest point of the second epitaxy region; and
      after the step of epitaxially growing the second epitaxy region, forming a second main spacer on a sidewall of the second thin spacer.

2. The method of claim 1 further comprising:
   after the step of forming the first main spacer, implanting the first epitaxy region to form a first deep source/drain region; and
   after the step of forming the second main spacer, implanting the second epitaxy region to form a second deep source/drain region.

3. The method of claim 1 further comprising:
   after the step of forming the first main spacer, forming a first silicide region on the first epitaxy region, with an inner portion of the first epitaxy region not silicided, and an outer portion of the first epitaxy region silicided; and
   after the step of forming the second main spacer, forming a second silicide region on the second epitaxy region, with an inner portion of the second epitaxy region not silicided, and an outer portion of the second epitaxy region silicided.

4. The method of claim 1, wherein the lowest point of the first epitaxy region is lower than a top surface of a neighboring shallow trench isolation (STI) region, and the lowest point of the second epitaxy region is not lower than the top surface of the neighboring STI region.

5. The method of claim 1, wherein the step of epitaxially growing the first epitaxy region comprises epitaxially growing silicon germanium, and the step of epitaxially growing the second epitaxy region comprises epitaxially growing silicon phosphorous.

* * * * *